United States Patent [19]

Marek

[11] 3,914,780

[45] Oct. 21, 1975

[54] CONTINUOUSLY CONTROLLABLE SEMI-CONDUCTOR POWER COMPONENT

[75] Inventor: Alois Marek, Nussbaumen, Switzerland

[73] Assignee: BBC Brown, Boveri & Company, Limited, Baden, Switzerland

[22] Filed: Feb. 6, 1973

[21] Appl. No.: 329,983

[30] Foreign Application Priority Data

Mar. 27, 1972 Switzerland ........................ 4398/72

[52] U.S. Cl. ...................... 357/37; 357/22; 357/38; 357/39; 357/55; 357/58

[51] Int. Cl.² ........................................ H01L 29/00

[58] Field of Search... 317/235 AB, 235 AA, 235 R, 317/235 AJ; 357/37, 38, 39, 58, 22, 81, 55

[56] References Cited

UNITED STATES PATENTS

| | | | |
|---|---|---|---|
| 2,623,102 | 12/1952 | Shockley | 357/37 |
| 3,078,196 | 2/1963 | Ross | 148/33 |
| 3,091,701 | 5/1963 | Statz | 357/37 |
| 3,264,492 | 8/1966 | Gault | 307/88.5 |
| 3,300,658 | 1/1967 | Slusher et al. | 357/37 |
| 3,328,652 | 6/1967 | Sylvan | 317/235 |
| 3,370,209 | 2/1968 | Davis et al. | 317/235 |
| 3,389,024 | 6/1968 | Schimmer | 148/188 |
| 3,404,295 | 10/1968 | Warner | 357/37 |
| 3,411,054 | 11/1968 | Cullis | 317/235 |
| 3,476,993 | 11/1969 | Aldrich et al. | 357/38 |
| 3,536,938 | 10/1970 | Boksjo | 307/305 |
| 3,538,401 | 11/1970 | Chu | 317/235 |
| 3,564,291 | 2/1971 | Aagard | 307/252 |
| 3,617,829 | 11/1971 | Lesk | 317/235 R |
| 3,739,235 | 1/1972 | Kessler | 317/234 R |

*Primary Examiner*—Andrew J. James
*Assistant Examiner*—Joseph E. Clawson, Jr.
*Attorney, Agent, or Firm*—Oblon, Fisher, Spivak, McClelland & Maier

[57] ABSTRACT

A continuously variable semiconductor component is disclosed which is capable of handling voltage differentials of 1 kilovolt or more and which is capable of controlling over 200 watts of power. The device includes at least five zones of different impurity dopings wherein the first four zones form a series of alternating conductivities, with the main terminals being located at the first and fifth zones. The second zone is provided with the control connection and the fourth zone is held at a fixed potential at an absolute value less than or equal to the potential of the main terminal in the fifth zone. The first zone is provided with higher impurity doping in the area adjacent to the fourth zone than exists in the fourth zone. The thickness of the second zone is also made less than that of the fourth zone.

12 Claims, 5 Drawing Figures

CONTINUOUSLY CONTROLLABLE SEMI-CONDUCTOR POWER COMPONENT

BACKGROUND OF THE INVENTION

1. Field of the Invention

The invention relates generally to semiconductor devices and more particularly to a continuously controllable semiconductor power component.

2. Description of the Prior Art

Bi-stable, controllable semiconductor power components, such as thyristors, which may be switched from a blocking to a transmitting state, are commonly known. In extreme cases these devices may be used for currents up to 500 amperes and potentials up to 5 kv. In contrast, previously known continuously controllable semiconductor components, such as junction transistors, may be subjected only transiently to about 30 amps and 300 v, and up to 1,000 v for small currents. This is due in part in conventional three-layer components to the requirement of a thin and low-doped base zone for good current amplification, so that the blocking capacity of the collector zone is degraded.

Because of this state of affairs, transistors have already been provided with a remote base. Such are provided with a sequence of four zones of alternating conductivities, the collector being connected to the first outer zone, the base to the second outer zone, and the emitter to that inner zone which is adjacent to the outer zone with a base connection. The blocking capacity of such transistors is improved by making the inner zone without connection to the outside of high ohmic value. However such components as described suffer from poor DC characteristics. For instance, they may have a current amplification of only unity.

SUMMARY OF THE INVENTION

Accordingly, one object of this invention is to provide a novel continuously controllable semiconductor power component.

Another object of this invention is the provision of a novel continuously controllable semiconductor power component capable of handling high potentials and large currents over a broad range of frequencies.

Briefly, these and other objects of the invention are achieved by constructing a power semiconducting component with at least five zones of different impurity dopings, wherein the first four zones form a series of alternating conductivities, with the main terminals being located at the first and fifth zones. The second zone is provided with the control connection and the fourth zone is held at a fixed potential at an absolute value less than or equal to the potential of the main terminal in the fifth zone. The first zone is provided with higher impurity doping than the second zone, and the third zone is provided with a higher impurity doping in the area adjacent to the fourth zone than exists in the fourth zone. The thickness of the second zone is also made less than that of the fourth zone.

As a first approximation, the component according to the invention may be thought of as a cascade-like connection of a first transistor, from the first through third zones, with a second transistor, from the third through fifth zones, in such a manner that the collector of the first transistor simultaneously acts as the emitter of the second transistor. The component may also be designated as a remote emitter transistor.

The component according to the invention carries an appreciable advantage in that the portion corresponding to the first transistor may be designed solely for good DC and good high frequency characteristics without considering high potentials, as for instance large current amplification, good linearity and transit frequencies. The portion corresponding to the second transistor may be almost solely designed with respect to high blocking capacity or peak-inverse voltage and good heat transfer. Together, the two transistors according to the invention provide a continuously controllable component rated for high loads and operating at high cut-off frequencies.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
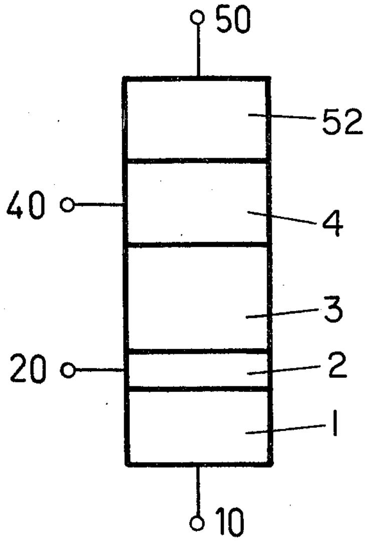
FIG. 1 is an illustration of a first embodiment of the invention in diagrammatic form.

Referring now to the drawings, wherein like reference numerals designate identical or corresponding parts throughout the several views, and more particularly to FIG. 1 thereof, a five-layer component according to the invention is shown including five zones 1, 2, 3, 4 and 52. The device also includes a pair of main connections or terminals 10 and 50, a control terminal 20 and a fixed potential terminal 40. The fundamental task of the invention is solved with particular advantage in such a component by providing the first zone 1 with a higher impurity doping than the second zone 2, and by providing the third zone 3 with a higher impurity doping in the regions adjacent to the fourth zone 4 than in the latter zone, and by making the thickness of the second zone 2 less than that of the fourth zone 4. The higher impurity doping of the first zone 1 with respect to the second zone 2 causes a high emitter efficiency which, together with the reduced thickness of the second zone 2, causes a high current amplification factor. The current is thus made easily controllable via current terminal 20 coupled to the second zone 2 and will be fed through the third zone 3 into the fourth zone 4 and into the fifth zone 52, where again good emitter efficiency is achieved because of the relatively higher doping of the region in the third zone 3 which is adjacent to the fourth zone 4. However, the fourth zone 4, because of its greater thickness and more moderate doping, permits larger punch-through and avalanche breakdown voltages with respect to the transition into the ensuing fifth zone 52. Furthermore, the danger of secondary breakdown, as would occur from the formation of hot channels, is appreciably reduced in the described component. This is so because as long as the portion of the component comprising the first through the third zones (which is only slightly loaded thermally) remains stable, the current distribution in the portion comprising the fourth and fifth zones also remains stable and largely independent of the thermal loading of that portion. This stability is further enhanced by the high sheet resistance of the fourth zone 4.

Figure 2:
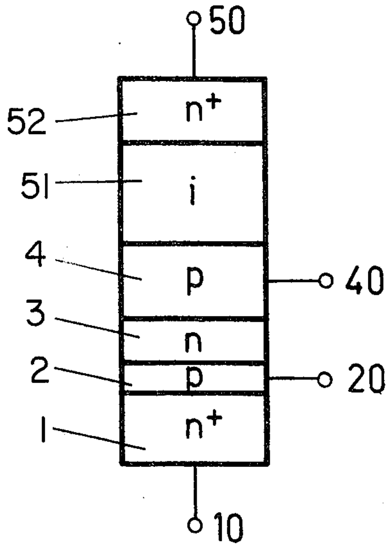
FIG. 2 is an illustration of a second embodiment of the invention in diagrammatic form.

Specific types of dopings have been assumed for the device illustrated in FIG. 2. Also, a zone 51 has been provided between the fourth zone 4 and the fifth zone 52. The first zone 1 still is highly n-doped, the second zone 2 slightly p-doped, the third zone 3 highly n-doped in the area adjacent to the fourth zone 4 and less n-doped in the region adjacent with the second zone 2, the fourth zone 4 is moderately p-doped, and the fifth zone 52 is very highly n-doped. Within the scope of that which is practically feasible, zone 51 lacks any kind of impurity conduction, and shows only intrinsic conduction. The component may be operated with a high potential (up to 5 kv for instance) applied to the main terminal 50, while the main terminal 10 is at ground potential. A fixed potential of about 10 v may be applied to the fixed-potential terminal 40 and the control terminal 20 may be driven by a control potential of 1v.

An electron current which may be easily controlled by the potential applied at the control terminal 20 is injected from zone 1 into zone 2 in the illustrated component. Since the p-n transition from zone 2 to zone 3 is polar, electrons will be attracted into zone 3 and will further be injected into zone 4 on account of the positive potential on terminal 40. The main potential drop-off occurs from zone 4 to zone 52. The electrons injected into zone 4 will be driven through zone 51 into zone 52 because of the potential gradient's field.

The permissible potential $U_{50\text{-}10}$ between terminals 50 and 10 in the upper limit is equal to the sum of the potential $U_{40\text{-}10}$ between terminals 40 and 10 and the maximum admissible potential $U_{50\text{-}40}$ between terminals 40 and 50. The latter is exclusively determined by the breakdown voltage of the p-n junction or of the pin transition from zone 4 to zone 52, where the breakdown voltage may be optimized in a known manner by low doping and a suitably large thickness of zone 4. The lower limit of the potential $U_{50\text{-}40}$ equals the potential $U_{40\text{-}10}$.

For a sufficiently high potential $U_{50\text{-}10}$, recombination causes most of the power loss in zone 52. In order to avoid feed-back to zones 1 and 2, a thick zone 51 with intrinsic conduction is provided, causing thermal decoupling of zone 52 from the other zones. Zone 3 may also be made especially thick in order to achieve such decoupling, in lieu of zone 52 or in addition thereto. Joule heating also arises in zone 51 on account of series resistance. Zones 51 and/or 52 are preferably cooled in a known manner. Despite large power-conversions, the heat-sensitive zones 1 and 2 may then be kept unaffected. This is particularly easy to do when zones 1 and 2 are also cooled. The cooling devices may operate in a known manner, preferably by means of evaporation.

The differential output resistance $dU_{50\text{-}10}/dI_{50}$, where $I_{50}$ is the current passing through terminal 50, is very large for the component shown. It is approximately equal to the sum of the differential output resistance of a grounded-emitter transistor comprising zones from 3 up to 52, added to the differential output resistance of a grounded-emitter comprising zones 1, 2 and 3, the second term being multipled by the amplification factor $u = JU_{3\text{-}10}/JU_{20\text{-}10}$ of the first transistor, where $U_{3\text{-}10}$ is the potential drop-off from zone 3 to terminal 10. The product is 2 or 3 decades larger than the first term.

The DC dependency of the current $I_{50}$ on the potential $U_{20\text{-}10}$ is determined solely by the parameters of the transistor comprising zones 1, 2 and 3. If $\beta_{tot} = I_{50}/I_{20}$, $\beta_1 = I_3/I_{20}$ and $\beta_2 = I_{50}/I_3$, where $I_{20}$ is the current flowing through control terminal 20 and $I_3$ that flowing through zone 3, then the total current amplification of the component is $\beta_{tot} = \beta_1\alpha_2$. This dependency remains up to high frequencies, because only the cut-off frequencies $f\beta_1$ and $f\alpha_2$ are determinant.

Figure 4:
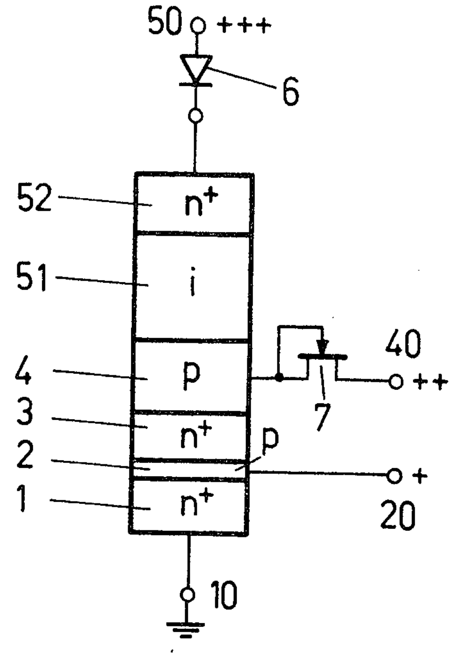
FIG. 4 a component according to FIG. 3 coupled to a diode and an FET diode; and, FIG. 5 is a graphical diagram showing characteristic curves for a component according to the present invention.
Figure 5:
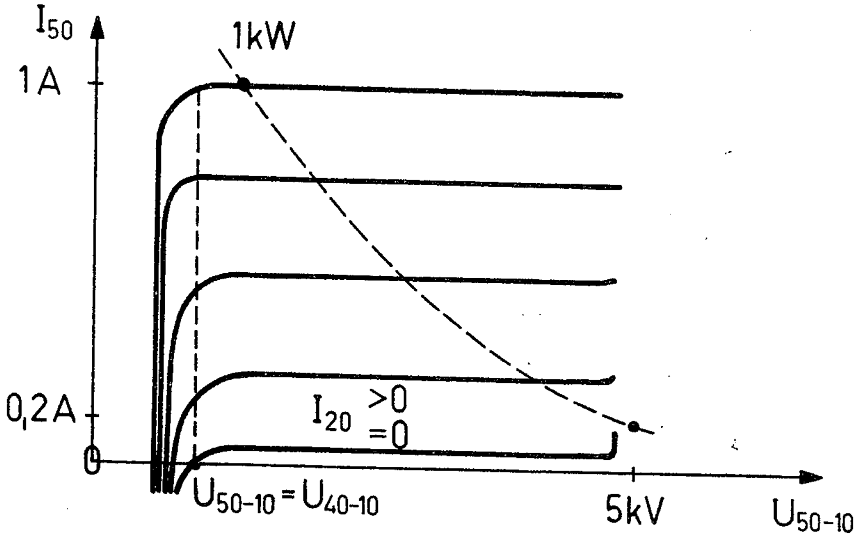

The characteristic curves shown in FIG. 5 reflect several of the above described properties. The curve shown in dotted lines shows the maximum loading limit for 1 kw. The shape of the characteristic curves shows the large differential output resistance $dU_{50\text{-}10}/dI_{50}$ and also the effect of the current $I_{50}$ assuming negative values for positive potentials $U_{50\text{-}10} < U_{40\text{-}10}$. Such negative currents often being undesirable, a diode 6 is provided in the main current path in FIG. 4 according to another preferred embodiment of the invention, which will block such negative currents. A FET diode 7 will limit any negative currents $I_{50}$ while simultaneously limiting current $I_3$, on account of its pentode-like characteristic curve. (Presently such FET diodes are commercially manufactured by Motorola for the range up to about 100 v and 5 ma. Changing the geometry allows increasing the current).

Figure 3:
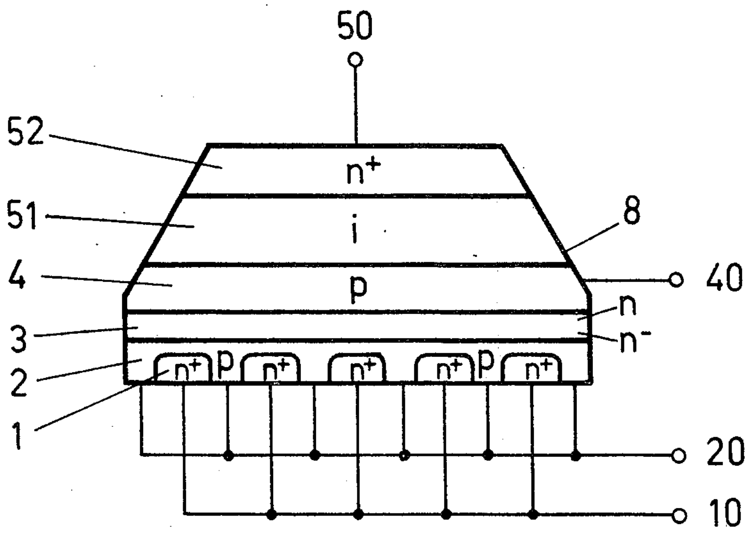
FIG. 3 is an illustration of one possible configuration of the component shown in FIG. 2 in diagrammatic form.

FIG. 3 represents a possible structural configuration of the component according to the invention. Zones 4 and 3 are first preferably deposited epitaxially on an i-substrate 51. Zone 2 then is made by diffusion. Finally, zones 1 and 52 are made by diffusion or are again epitaxial. Surface 8 of the upper part of the component is constructed so that it forms an acute angle at the transition from zone 4 to zone 51 with the plane of that transition to zone 52. This reduces the surface field strength in a known manner and allows a volume breakthrough.

Zones 1 and 2 extend adjacent one another as much as possible in a manner known per se as regards transistors. As an example, the zones are made in the shape of intermeshing combs. Both zones are provided throughout their surfaces with electrodes for terminals 10 and 20. In this manner, the current emitted from zone 1 may be controlled precisely and continuously by means of the potential applied to zone 2 via terminal 20. The fixed-potential terminal, which makes contact with zone 4 is preferably in the form of an annular electrode surrounding the component.

The dimensions of the component may be selected from the table below:

TABLE

| Zone | Layer Thickness [μm] | Conductor | Doping [cm³] |
|---|---|---|---|
| 52 | 1 | $n^+$ | $10^{20}$ |
| 51 | 600 | $n^-$ | $2.4 \times 10^{13}$ |
| 4 | 20 | p | $10^{16}$ |
| 3 (upper range) | 0.1 | n | $5 \times 10^{17}$ |
| 3 (lower range) | 1.5 | $n^-$ | $2.4 \times 10^{13}$ |
| 2 | 0.5 | p | $10^{16}$ |
| 1 | 1 | $n^+$ | $10^{20}$ |

The thickness of zones 51 and 4 are selected so that no voltage breakthrough occurs even for 5 kv. The thickness of the area of zone 3 adjacent to zone 4 (upper range) is very slight, so that the transverse conductivity of this region will not significantly affect the current distribution in the cross-section of the component if the latter makes contact with the annular fixed potential terminal. The surface resistance of this area is larger than that of zone 4. Doping of this region is still high because of the injection into zone 4. On the other hand, the doping of the region of zone 3 adjacent to the second zone 2 (lower range) is minor and its thickness is appreciably larger so that this region may absorb a sufficiently high inverse potential with respect to zone 2.

In order to avoid thyristor ignition, that is, in order to prevent minority carriers in zone 3 from getting from zone 4 into zone 2, zone 3 is preferably doped with a substance decreasing the lifetime of those minority carries, for instance gold.

If the component is well cooled, there may be average power conversions of 1 kw, for instance. If $U_{50\text{-}10} =$ 1,000 v, and $U_{40\text{-}10} =$ 10v, the permissible continuous current load is approximately $I_{50} =$ 1 amp, and $I_{40} \approx$ 10 ma. If $U_{50\text{-}10} =$ 5 kv ( and $U_{40\text{-}10} =$ 10 v), the permissible steady state current is about 200 ma. For pulse-like loading, with pulse durations of 1 microsecond and a repetition frequency less than $10^4$/sec, currents of 20 amp are permissible, while for pulse durations of about 10 micro-seconds at the same repetition frequency currents of about 2 amp are permissible.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor power component the current through which may be controlled in a non-discrete, continuous, and reversible fashion, which comprises:

first, second, third, fourth and fifth sequentially positioned semiconductor zones each having a different impurity doping, said first through fourth zones forming a zone sequence of alternating conductivities;

first main terminal means coupled to said first zone;

second main terminal means coupled to said fifth zone which is adapted to be coupled to a first source of potential;

fixed potential terminal means coupled to said fourth zone for connecting said fourth zone to a second source of potential having an absolute magnitude less than or equal to the absolute magnitude of said first source of potential; and control means coupled to said second zone for continuously varying the magnitude of the current flowing from said first main terminal means to said second main terminal means wherein said first zone is provided with a higher impurity doping than said second zone, and wherein said third zone is provided with a higher impurity doping than said fourth zone in a portion thereof adjacent to said fourth zone, and wherein the thickness of said second zone is less than that of said fourth zone.

2. A continuously variable semiconductor power component as in claim 1, further comprising:

a sixth zone having intrinsic conductivity positioned between said fourth and fifth zones.

3. A continuously variable semiconductor power component as in claim 1, wherein:

said second source of potential provides a voltage less than twelve volts greater than the voltage applied to said main terminal means coupled to said first zone.

4. A continuously variable semiconductor power component as in claim 3, wherein:

said first source of potential applies a voltage to said main terminal means coupled to said fifth zone which exceeds by more than 1 kv said voltage applied to said main terminal means coupled to said first zone.

5. A continuously variable semiconductor power component as in claim 4, wherein:

said component controls more than 200 watts of power.

6. A continuously variable semiconductor power component as in claim 1, further comprising:

diode means coupled to said main terminal means for blocking a charge carrier current from said main terminal means coupled to said fifth zone to said control terminal.

7. A continuously variable semiconductor power component as in claim 6, further comprising:

an FET diode coupled to said fixed potential terminal means.

8. A continuously variable semiconductor power component as in claim 1, further comprising:

a cooling device coupled to the surface of said fifth zone.

9. A continuously variable semiconductor power component as in claim 1, further comprising:

a cooling device provided for said first, second and third zones.

10. A continuously variable semiconductor power component as in claim 2, wherein:

said component is shaped so that an acute angle is formed between a first plane defined by an exterior surface of said component and a second plane formed by the transition between said fourth and sixth zones.

11. A continuously variable semiconductor power component as in claim 1, wherein:

said portion of said third zone has a doping factor 10 times greater than that of said fourth zone, and wherein said portion of said third zone is less than one-hundredth the thickness of said fourth zone and less than one-tenth the thickness of the remainder of said third zone.

12. A continuously variable semiconductor power component as in claim 11, wherein:

said third zone is doped with a minority carrier life time reducing substance.

* * * * *